United States Patent [19]

Sota

[11] Patent Number: 5,757,080
[45] Date of Patent: May 26, 1998

[54] RESIN-SEALED SEMICONDUCTOR DEVICE

[75] Inventor: Yoshiki Sota, Tenri, Japan

[73] Assignee: Sharp Kabushiki Kaisha, Osaka, Japan

[21] Appl. No.: 607,213

[22] Filed: Feb. 26, 1996

[30] Foreign Application Priority Data

Mar. 30, 1995 [JP] Japan .................... 7-072881

[51] Int. Cl.$^6$ .................... H01L 23/48; H01L 23/52; H01L 29/40
[52] U.S. Cl. .................... 257/777; 257/685; 257/686
[58] Field of Search .................... 257/777, 685, 257/686, 666, 672, 674, 669

[56] References Cited

U.S. PATENT DOCUMENTS

| | | | |
|---|---|---|---|
| 4,541,003 | 9/1985 | Otsuka et al. | 257/777 |
| 5,331,235 | 7/1994 | Chun | 257/777 |
| 5,530,292 | 6/1996 | Waki et al. | 257/777 |

FOREIGN PATENT DOCUMENTS

| | | |
|---|---|---|
| 62-147360 | 9/1987 | Japan . |
| 2-54248 | 4/1990 | Japan . |
| 4-103141 | 4/1992 | Japan . |
| 4-184949 | 7/1992 | Japan . |

*Primary Examiner*—Mahshid D. Saadat
*Assistant Examiner*—Jhihan B. Clark
*Attorney, Agent, or Firm*—Nixon & Vanderhye

[57] ABSTRACT

The resin-sealed semiconductor device of this invention includes: a first semiconductor chip having a plurality of terminals, a first surface on which the plurality of terminals are formed, and a second surface opposite to the first surface; a second semiconductor chip having a plurality of terminals, a first surface on which the plurality of terminals are formed, and a second surface opposite to the first surface; a third semiconductor chip having a plurality of terminals, a first surface on which the plurality of terminals are formed, and a second surface opposite to the first surface; and a lead frame having a plurality of leads connected with at least one of the plurality of terminals of the first semiconductor chip, at least one of the plurality of terminals of the second semiconductor chip, and at least one of the plurality of terminals of the third semiconductor chip, wherein the first semiconductor chip and the second semiconductor chip are disposed so that the first surface of the first semiconductor chip and the first surface of the second semiconductor chip face each other, and the second surface of the first semiconductor chip is bonded with the second surface of the third semiconductor chip.

30 Claims, 14 Drawing Sheets

Chip selection control terminal

RESIN-SEALED SEMICONDUCTOR DEVICE

BACKGROUND OF THE INVENTION

1. Field of the Invention:

The present invention relates to a resin-sealed semiconductor device where three or more semiconductor chips are stacked vertically in a package and sealed with resin.

2. Description of the Related Art:

In recent years, while electronic apparatus having electronic components such as semiconductors have achieved higher performance, they have been increasingly made smaller, thinner and lighter. As electronic apparatus have become smaller, thinner, and lighter, electronic components incorporated therein have been required to be smaller, thinner, and lighter. More specifically, the density of electronic components integrated on a substrate of an electronic apparatus is required to be high, so that electronic components of the same quantity as that of the electronic components integrated on a conventional substrate can be integrated on a substrate smaller than the conventional substrate. One of the techniques developed to satisfy the above requirement is to dispose a plurality of semiconductor chips in a resin-sealed semiconductor device.

Referring to FIGS. 1 to 5, conventional resin-sealed semiconductor devices will be described.

A resin-sealed semiconductor device shown in FIG. 1 includes two semiconductor chips 1 arranged horizontally in a package. The two semiconductor chips 1 are disposed on a die-pad 8 which is part of a lead frame. Terminals of each of the semiconductor chips 1 are connected with gold wires 3, and some of the terminals are connected with inner lead portions 2 via the gold wires 3. The inner lead portions 2 are part of the lead frame. The thus-obtained semiconductor device is sealed with a resin 4.

A resin-sealed semiconductor device shown in FIG. 2 includes two semiconductor chips 1 arranged vertically in a package. Each of the semiconductor chips 1 includes a first surface having a plurality of terminals formed thereon and a second surface opposite to the first surface. The second surface of one of the semiconductor chips 1 is die-bonded with a top surface of a die-pad 8, while the second surface of the other semiconductor chip 1 is die-bonded with a bottom surface of the die-pad 8. The terminals of each of the semiconductor chips 1 are connected with inner lead portions 2 via gold wires 3. The thus-obtained semiconductor device is sealed with a resin 4 as shown in FIG. 2. The type of resin-sealed semiconductor device shown in FIG. 2 is disclosed in Japanese Laid-Open Utility Model Publication No. 62-147360.

A resin-sealed semiconductor device shown in FIG. 3 includes two semiconductor chips 1 arranged vertically in a package. Each of the semiconductor chips 1 includes a first surface having a plurality of terminals formed thereon and a second surface opposite to the first surface. The second surface of one of the semiconductor chips 1 is attached to the second surface of the other semiconductor chip 1. Each of the terminals formed on the first surfaces of the semiconductor chips 1 is directly connected with an end of each of leads 5. The leads 5 are formed on the flexible substrates 6 by patterning. The other end of the lead 5 is connected to an inner lead portion 2. The thus-obtained semiconductor device is sealed with a resin 4 as shown in FIG. 3. The type of resin-sealed semiconductor device shown in FIG. 3 is disclosed in Japanese Laid-Open Patent Publication No. 4-184949.

A resin-sealed semiconductor device shown in FIG. 4 includes two semiconductor chips 1 arranged vertically in a package. Each of the semiconductor chips 1 includes a first surface having a plurality of terminals formed thereon and a second surface opposite to the first surface. The first surface of one of the semiconductor chips 1 faces the first surface of the other semiconductor chip 1. Each of the terminals formed on the first surface of one of the semiconductor chips 1 is directly connected with an end of each of leads 5 formed by patterning flexible substrates 6. The terminal formed on the first surface of the other semiconductor chip 1 is directly connected to an end of a corresponding lead 5 formed by patterning a flexible substrate 6. The type of resin-sealed semiconductor device shown in FIG. 4 is disclosed in Japanese Laid-Open Patent Publication No. 4-184949.

A resin-sealed semiconductor device shown in FIG. 5 is an improved version of the resin-sealed semiconductor device shown in FIG. 2. The type of resin-sealed semiconductor device shown in FIG. 5 is disclosed in Japanese Laid-Open Utility Model Publication No. 2-54248. In this device, two lead frames, each having inner lead portions 2a and 2b, respectively, with two semiconductor chips bonded to each frame as shown in FIG. 2 are attached together. The four semiconductor chips and part of the lead frames are sealed with resin.

SUMMARY OF THE INVENTION

The resin-sealed semiconductor device of this invention includes: a first semiconductor chip having a plurality of terminals, a first surface on which the plurality of terminals are formed, and a second surface opposite to the first surface; a second semiconductor chip having a plurality of terminals, a first surface on which the plurality of terminals are formed, and a second surface opposite to the first surface; a third semiconductor chip having a plurality of terminals, a first surface on which the plurality of terminals are formed, and a second surface opposite to the first surface; and a lead frame having a plurality of leads connected with at least one of the plurality of terminals of the first semiconductor chip, at least one of the plurality of terminals of the second semiconductor chip, and at least one of the plurality of terminals of the third semiconductor chip, wherein the first semiconductor chip and the second semiconductor chip are disposed so that the first surface of the first semiconductor chip and the first surface of the second semiconductor chip face each other, and the second surface of the first semiconductor chip is bonded with the second surface of the third semiconductor chip.

In one embodiment of the invention, the device further includes a fourth semiconductor chip having a plurality of terminals, a first surface on which the plurality of terminals are formed, and a second surface opposite to the first surface, wherein the second surface of the second semiconductor chip is bonded with the second surface of the fourth semiconductor chip.

In another embodiment of the invention, a circuit pattern of the first semiconductor chip and a circuit pattern of the second semiconductor chip are in a mirror-inverted relationship, the first semiconductor chip has at least one control terminal for selecting the first semiconductor chip, and the second semiconductor chip has at least one control terminal for selecting the second semiconductor chip.

In still another embodiment of the invention, a circuit pattern of the first semiconductor chip and a circuit pattern of the third semiconductor chip are in a mirror-inverted relationship, the first semiconductor chip has at least one control terminal for selecting the first semiconductor chip, and the third semiconductor chip has at least one control terminal for selecting the third semiconductor chip.

In still another embodiment of the invention, mirror-inverted positions of at least one of the terminals of the first semiconductor chip in a first plane are the same as positions of at least one of the terminals of the third semiconductor chip in the first plane.

In still another embodiment of the invention, positions of at least one of the terminals of the second semiconductor chip in a first plane are the same as positions of at least one of the terminals of the third semiconductor chip in the first plane.

In still another embodiment of the invention, positions of at least one of the terminals of the first semiconductor chip in a first plane are the same as positions of at least one of the terminals of the fourth semiconductor chip in the first plane.

In still another embodiment of the invention, mirror-inverted positions of at least one of the terminals of the fourth semiconductor chip in a first plane are the same as positions of at least one of the terminals of the second semiconductor chip in the first plane.

In still another embodiment of the invention, mirror-inverted positions of at least one of the terminals of the fourth semiconductor chip in a first plane are the same as positions of at least one of the terminals of the third semiconductor chip in the first plane.

In still another embodiment of the invention, a circuit pattern of the second semiconductor chip and a circuit pattern of the fourth semiconductor chip are in a mirror-inverted relationship, the second semiconductor chip has at least one control terminal for selecting the second semiconductor chip, and the fourth semiconductor chip has at least one control terminal for selecting the fourth semiconductor chip.

In still another embodiment of the invention, a circuit pattern of the third semiconductor chip and a circuit pattern of the fourth semiconductor chip are in a mirror-inverted relationship, the third semiconductor chip has at least one control terminal for selecting the third semiconductor chip, and the fourth semiconductor chip has at least one control terminal for selecting the fourth semiconductor chip.

In still another embodiment of the invention, circuit patterns of the first, second, and third semiconductor chips are different from one another, and the terminals of the first, second, and third semiconductor chips are connected with respective different leads.

In still another embodiment of the invention, circuit patterns of the first, second, third, and fourth semiconductor chips are different from one another, and the terminals of the first, second, third, and fourth semiconductor chips are connected with respective different leads.

Thus, the invention described herein makes possible the advantages of (1) providing a resin-sealed semiconductor device including three or four semiconductor chips sealed therein, and (2) providing a resin-sealed semiconductor device with a thinner resin-sealed portion compared with a conventional resin-sealed semiconductor device where semiconductor chips are bonded to a die-pad which is part of a lead frame.

These and other advantages of the present invention will become apparent to those skilled in the art upon reading and understanding the following detailed description with reference to the accompanying figures.

DESCRIPTION OF THE PREFERRED EMBODIMENTS (Example 1)

Figure 1:
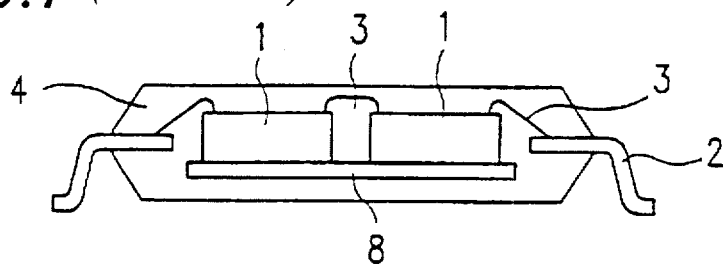
FIG. 1 is a sectional view of a conventional resin-sealed semiconductor device.
Figure 2:
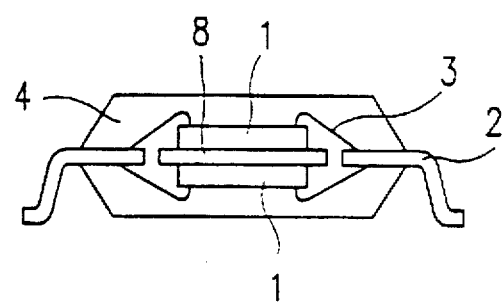
FIG. 2 is a sectional view of another conventional resin-sealed semiconductor device.
Figure 3:
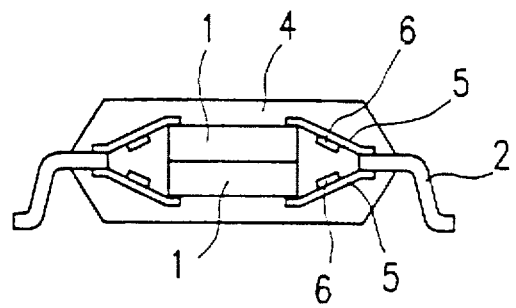
FIG. 3 is a sectional view of still another conventional resin-sealed semiconductor device.
Figure 4:
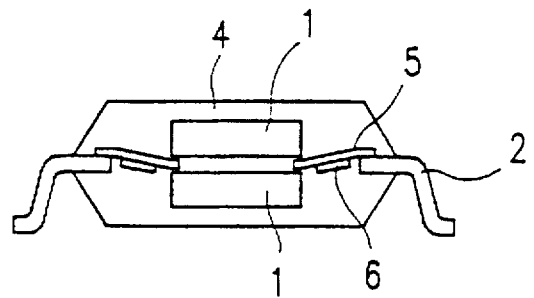
FIG. 4 is a sectional view of still another conventional resin-sealed semiconductor device.
Figure 5:
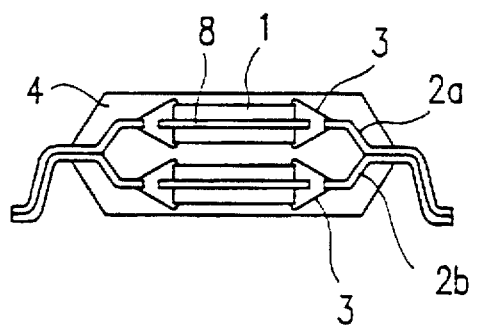
FIG. 5 is a sectional view of still another conventional resin-sealed semiconductor device.
Figure 6:
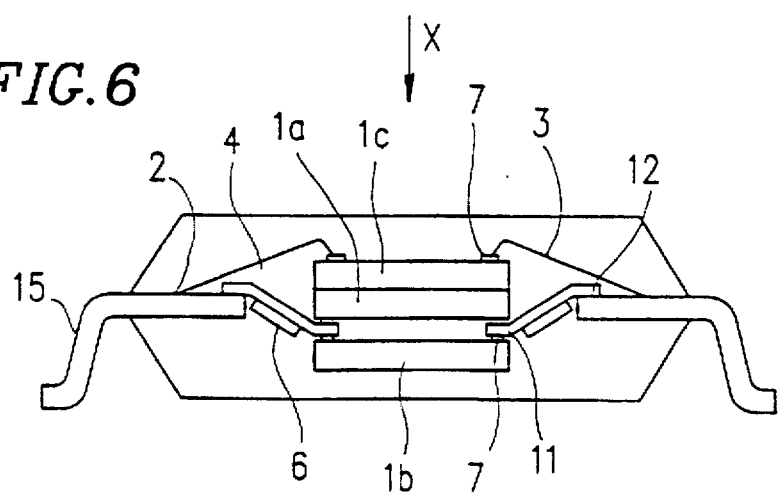
FIG. 6 is a sectional view of a resin-sealed semiconductor device according to the present invention.

A first example of the resin-sealed semiconductor device according to the present invention will be described with reference to FIG. 6.

The resin-sealed semiconductor device of Example 1 includes semiconductor chips 1a to 1c, a lead frame composed of inner lead portions 2 and outer lead portions 15, metal wires 3, and flexible substrates 6. Each of the flexible substrates 6 has connecting terminals 11 and 12. The semiconductor chips 1a to 1c, the inner lead portions 2 of the lead frame, the metal wires 3, and the flexible substrates 6 having the connecting terminals 11 and 12 are sealed with a resin 4. The semiconductor chips 1a to 1c may be ROM and/or RAM. The outer lead portions are not sealed and are to be used as terminals of the resin-sealed semiconductor device. A circuit pattern is formed on a first surface of each of the semiconductor chips 1a to 1c.

The three semiconductor chips 1a to 1c are arranged vertically. Each of the semiconductor chips 1a to 1c includes a first surface having a plurality of terminals 7 formed thereon and a second surface opposite to the first surface.

The semiconductor chips 1a and 1b are arranged so that the first surface of the semiconductor chip 1a faces the first surface of the semiconductor chip 1b. The terminals 7 of the semiconductor chip 1a are electrically connected with the terminals of the semiconductor chip 1b via the connecting terminals 11 of the flexible substrates 6. The terminals 7 of the semiconductor chips 1a and 1b may be directly connected with the connecting terminals 11. The connecting terminals 12 are connected with the inner lead portions 2 of the lead frame. The second surface of the semiconductor chip 1a is bonded with the second surface of the semiconductor chip 1c with an adhesive such as a silver base, a non-silver base, and a D/B adhesion sheet.

Figure 7:
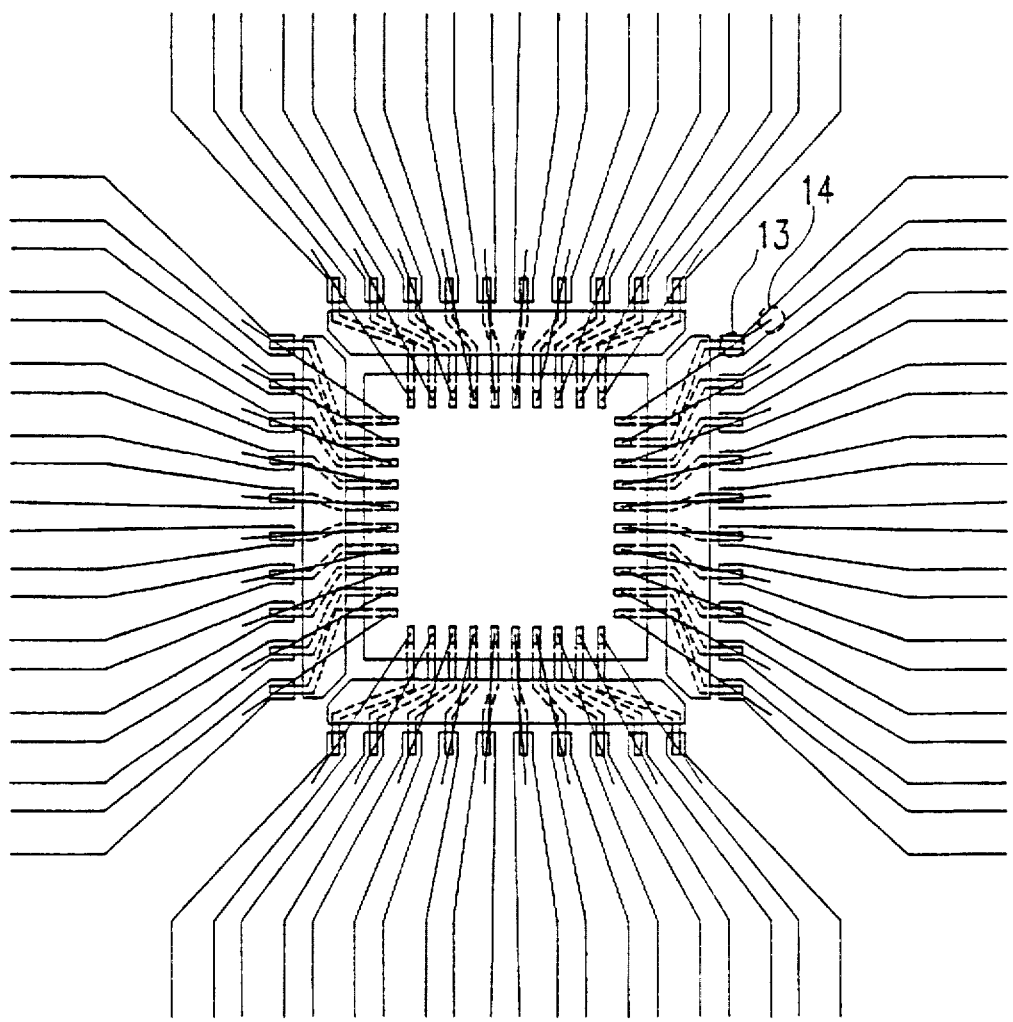
FIG. 7 is a top view of the resin-sealed semiconductor device of FIG. 6 viewed from an X direction.

The terminals 7 of the semiconductor chip 1c are electrically connected with the inner lead portions 2 by wire bonding. The metal wires 3 used for such wire bonding are preferably made of gold. FIG. 7 is a top view of the resin-sealed semiconductor device of FIG. 6 viewed from an X direction. A position 14 at which the metal wires 3 are connected with the inner lead portions 2 is farther from the semiconductor chip 1c than a position 13 at which the connecting terminals 12 of the flexible substrates 6 are connected with the inner lead portions 2. The inner lead portions 2 are plated with gold or silver at the position 14 of the connection with the metal wires 3.

Hereinbelow, the relationship between the circuit patterns of the semiconductor chips 1a to 1c and the sharing of the inner lead portions 2 among the semiconductor chips 1a to 1c will be described.

Figure 8:
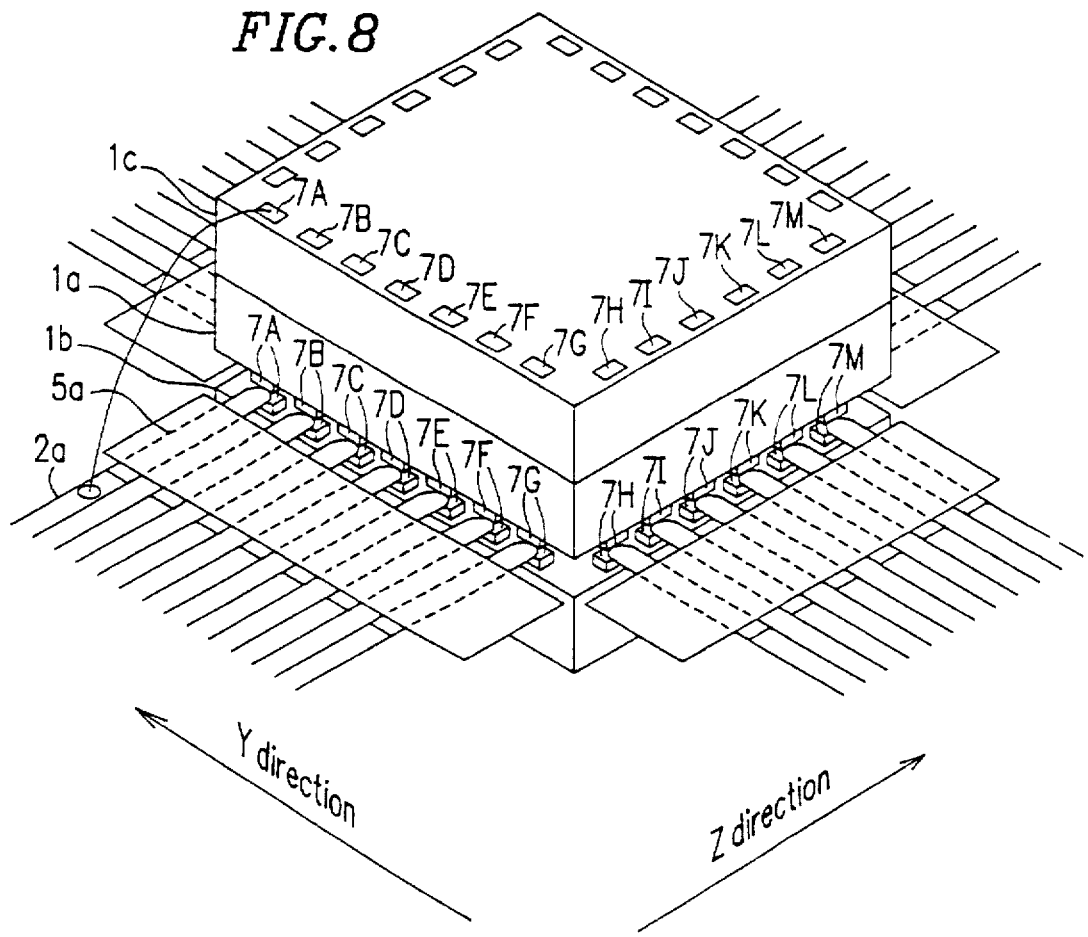
FIG. 8 is a perspective view of the resin-sealed semiconductor device of FIG. 6.

(1) When the circuit patterns of the semiconductor chips 1a and 1b are in a mirror-inversion relationship as shown in FIG. 8, they can share the same inner lead portions 2. For example, terminals 7A of the semiconductor chips 1a and 1b share a connecting terminal line 5a of the flexible substrate 6 and an inner lead 2a connected to the connecting terminal line 5a. In other words, both data input into or output from the terminal 7A of the semiconductor chip 1a and data input into or output from the terminal 7A of the semiconductor chip 1b pass through the connecting terminal line 5a and the inner lead 2a.

Each of the semiconductor chips 1a and 1b has at least one chip selection control terminal (not shown) for selecting the semiconductor chip 1a or 1b. Such chip selection control terminals of the semiconductor chips 1a and 1b are not allowed to share the same inner lead 2a.

When the semiconductor chips 1a and 1b share the same inner lead portions 2, the circuit patterns formed on the semiconductor chips 1a and 1b are not necessarily in a mirror-inversion relationship.

For example, when the mirror-inverted positions of the terminals of the semiconductor chip 1a in a first plane (Y-Z plane) are the same as the positions of the terminals of the semiconductor chip 1b in the first plane (Y-Z plane), the semiconductor chips 1a and 1b can share the same inner lead portions 2. In this case, as in the above case, the chip selection control terminals are connected to separate inner leads.

Also, when the mirror-inverted positions of at least one of the terminals of the semiconductor chip 1a in the first plane (Y-Z plane) are the same as the positions of at least one of the terminals of the semiconductor chip 1b in the first plane (Y-Z plane), these terminals of the semiconductor chips 1a and 1b can share the same inner lead portions 2. In this case, as in the above case, the chip selection control terminals are connected to separate inner leads.

(2) When the circuit patterns of the semiconductor chips 1b and 1c are the same, they can share the same inner lead portions 2. However, as in the above case, chip selection control terminals (not shown) of the semiconductor chips 1b and 1c for selecting the semiconductor chip 1b or 1c are not allowed to share the same inner lead 2a.

When the semiconductor chips 1b and 1c share the same inner lead portions 2, the circuit patterns formed on the semiconductor chips 1b and 1c are not necessarily the same.

For example, when the positions of the terminals of the semiconductor chip 1c in the first plane (Y-Z plane) are the same as the positions of the terminals of the semiconductor chip 1b in the first plane (Y-Z plane), the semiconductor chips 1b and 1c can share the same inner lead portions 2. In this case, as in the above case, the chip selection control terminals are connected to separate inner leads.

Also, when the positions of at least one of the terminals of the semiconductor chip 1c in the first plane (Y-Z plane) are the same as the positions of at least one of the terminals of the semiconductor chip 1b in the first plane (Y-Z plane), these terminals of the semiconductor chips 1b and 1c can share the same inner lead portions 2. In this case, as in the above case, the chip selection control terminals are connected to separate inner leads.

(3) When the circuit patterns of the semiconductor chips 1a and 1c are in a mirror-inversion relationship, they can share the same inner lead portions 2. However, as in the above case, chip selection control terminals (not shown) of the semiconductor chips 1a and 1c for selecting the semiconductor chip 1a or 1c are not allowed to share the same inner lead 2a.

When the semiconductor chips 1a and 1c share the same inner lead portions 2, the circuit patterns formed on the semiconductor chips 1a and 1c are not necessarily in a mirror-inversion relationship.

For example, when the mirror-inverted positions of the terminals of the semiconductor chip 1a in the first plane (Y-Z plane) are the same as the positions of the terminals of the semiconductor chip 1c in the first plane (Y-Z plane), the semiconductor chips 1a and 1c can share the same inner lead portions 2. In this case, as in the above case, the chip selection control terminals are connected to separate inner leads.

Also, when the mirror-inverted positions of at least one of the terminals of the semiconductor chip 1a in the first plane (Y-Z plane) are the same as the positions of at least one of the terminals of the semiconductor chip 1c in the first plane (Y-Z plane), these terminals of the semiconductor chips 1a and 1c can share the same inner lead portions 2. In this case, as in the above case, the chip selection control terminals are connected to separate inner leads.

Figure 17:
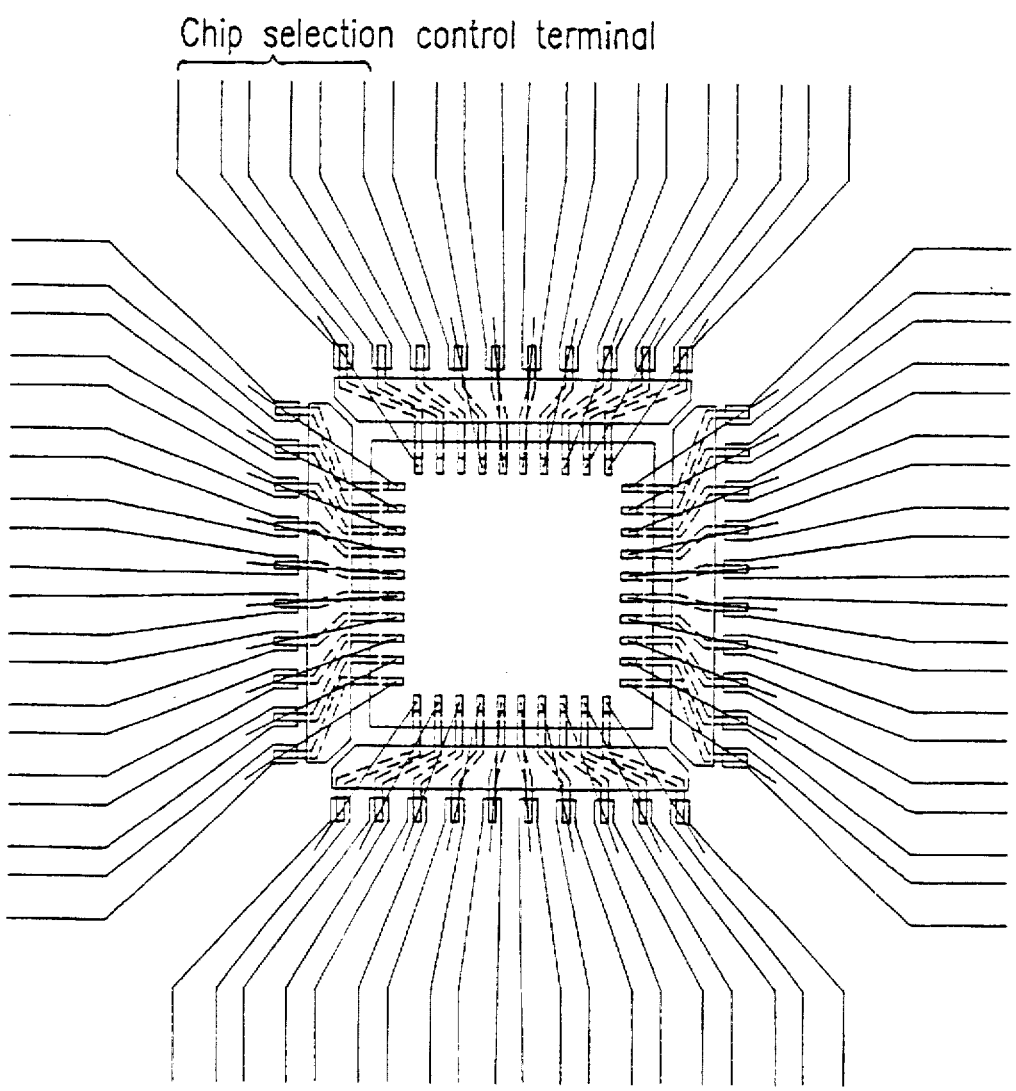
FIG. 17 is a top view of a resin-sealed semiconductor device according to the present invention.

(4) When the circuit patterns of the semiconductor chips 1a and 1b are in a mirror-inversion relationship and the circuit patterns of the semiconductor chips 1b and 1c are the same, the semiconductor chips 1a, 1b, and 1c can share the same inner lead portions 2. However, as in the above, case, chip selection control terminals (shown in FIG. 17) of the semiconductor chips 1a, 1b, and 1c for selecting the semiconductor chip 1a, 1b or 1c are not allowed to share the same inner lead 2a.

When the semiconductor chips 1a, 1b, and 1c share the same inner lead portions 2, the circuit patterns formed on the semiconductor chips 1a and 1b are not necessarily in a mirror-inversion relationship and the circuit patterns formed on the semiconductor chips 1b and 1c are not necessarily the same.

For example, when the mirror-inverted positions of the terminals of the semiconductor chip 1a in the first plane (Y-Z plane) are the same as the positions of the terminals of the semiconductor chip 1b in the first plane (Y-Z plane) and the positions of the terminals of the semiconductor chip 1c in the first plane (Y-Z plane) are the same as the positions of the terminals of the semiconductor chip 1b, the semiconductor chips 1a, 1b, and 1c can share the same inner lead portions 2. In this case, as in the above case, the chip selection control terminals for selecting the semiconductors 1a, 1b, or 1c are connected to separate inner leads.

Also, when the positions of at least one of the terminals of the semiconductor chip 1c in the first plane (Y-Z plane) are the same as the positions of at least one of the terminals of the semiconductor chip 1b in the first plane (Y-Z plane) and the mirror-inverted positions of at least one of the terminals of the semiconductor chip 1a in the first plane (Y-Z plane), these terminals of the semiconductor chips 1a to 1c can share the same inner lead portions 2. In this case, as in the above case, the chip selection control terminals for selecting the semiconductors 1a, 1b, or 1c are connected to separate inner leads.

When the inner leads are shared as described in the above situations (1) to (4), the number of inner leads of the inner lead portions 2 can be reduced compared with the situation where they are not shared.

Figure 18:
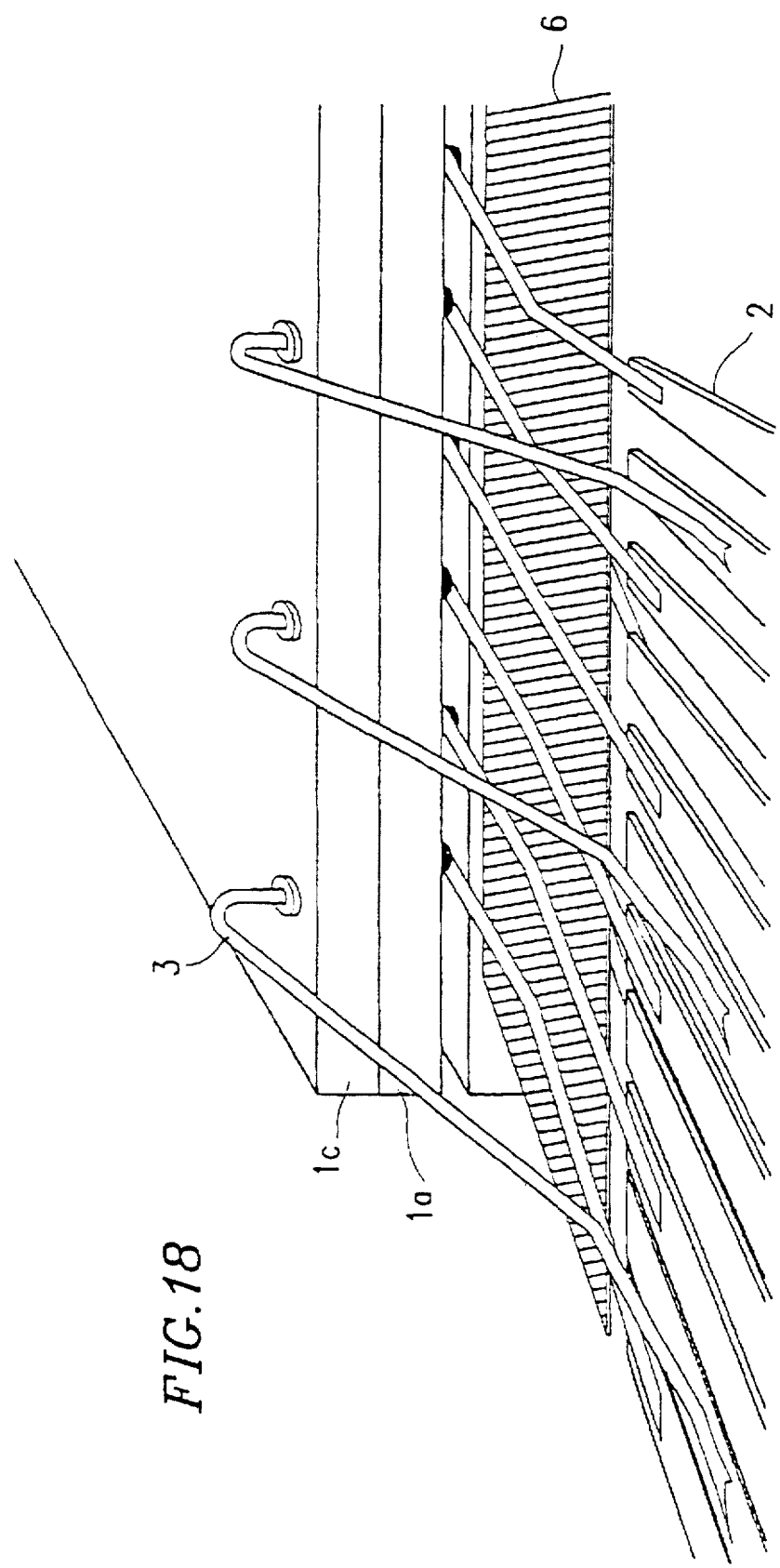
FIG. 18 is a perspective view of a resin-sealed semiconductor device according to the present invention.

When the semiconductor chips 1a, 1b, and 1c cannot share the inner leads of the inner lead portions 2, the respective terminals of the semiconductor chips 1a, 1b, and 1c are connected to their individual inner leads of the inner lead portions 2 (FIG. 18).

In the above case (4), when the semiconductor chips are memory devices, a resin-sealed semiconductor device with a capacity three times as large as a resin-sealed semiconductor device having only one semiconductor chip can be obtained.

(Example 2)

A second example of the resin-sealed semiconductor device according to the present invention will be described with reference to FIG. 9. The same components as those of the resin-sealed semiconductor device of Example 1 are denoted by the same reference numerals, and the description thereof is omitted.

The resin-sealed semiconductor device of Example 2 includes semiconductor chips 1a to 1c, a lead frame, and metal wires 3. The metal wires 3 are preferably made of gold.

Example 2 is different from Example 1 in the following manner. In Example 1, the terminals 7 of the semiconductor chip 1a are connected with the terminals 7 of the semiconductor chip 1b via the connecting terminals 11 of the flexible substrates 6. In Example 2, however, the flexible substrates 6 are not used. Instead, terminals 7 of the semiconductor chips 1a and 1b are electrically connected to tapered portions 20 of the lead frame. In order to reduce the vertical thickness of the resultant resin-sealed semiconductor device, a thickness L1 of the tapered portions 20 is preferably smaller than a thickness L2 of the inner lead portions 2 of the lead frame. A circuit pattern is formed on a first surface of each of the semiconductor chips 1a to 1c.

Figure 9:
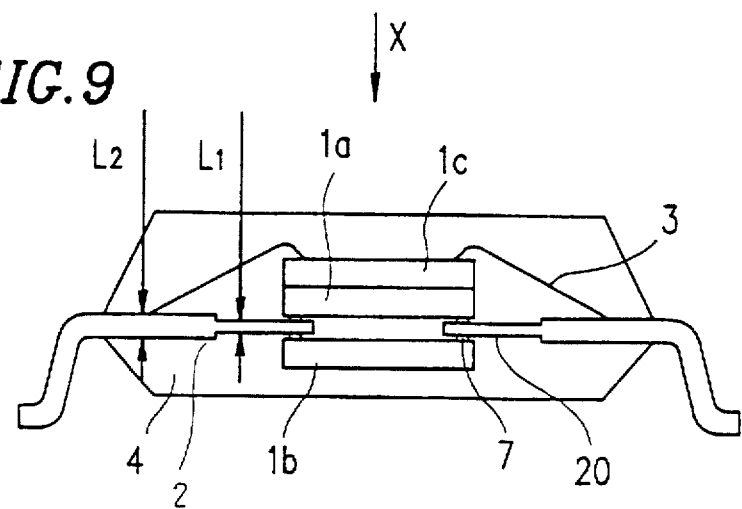
FIG. 9 is a sectional view of another resin-sealed semiconductor device according to the present invention.
Figure 10:
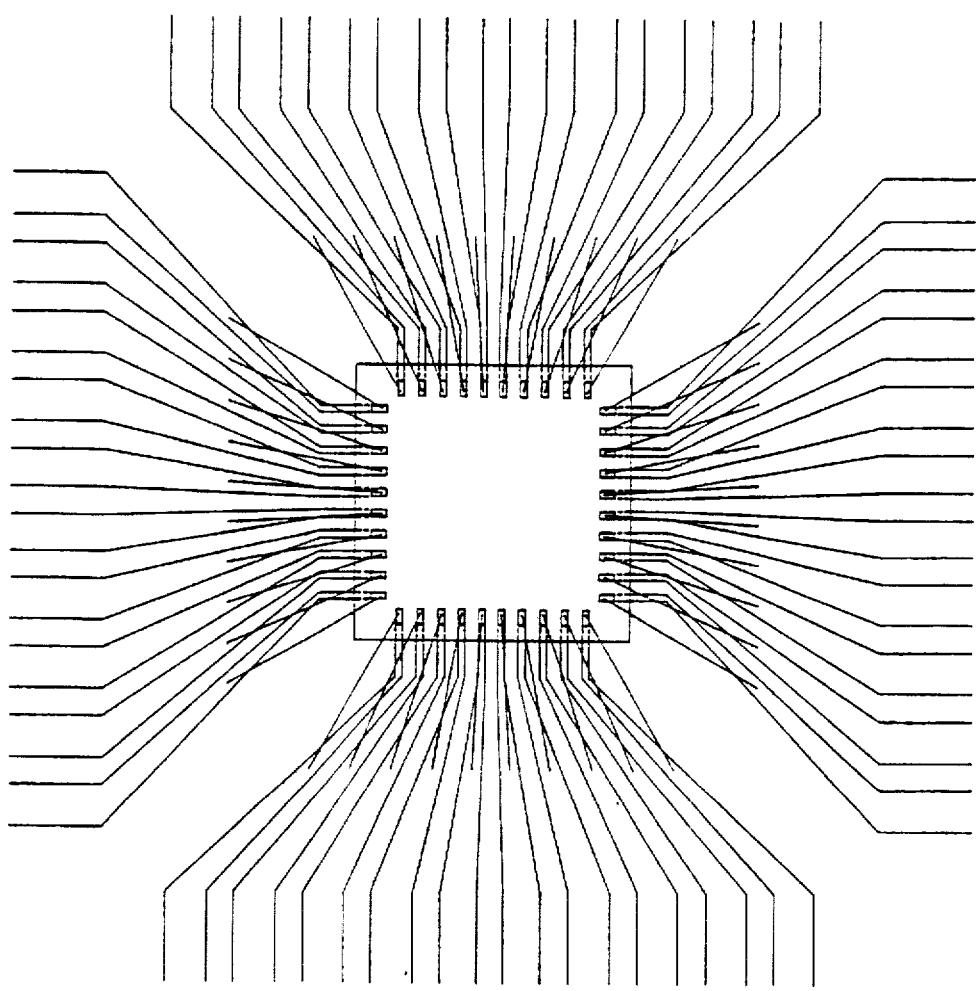
FIG. 10 is a top view of the resin-sealed semiconductor device of FIG. 9 viewed from an X direction.

FIG. 10 is a top view of the resin-sealed semiconductor device of FIG. 9 viewed from an X direction.

The relationship between the circuit patterns of the semiconductor chips 1a to 1c and the sharing of the inner lead portions 2 is the same as that described in Example 1, and therefore the description thereof is omitted here.

(Example 3)

Figure 11:
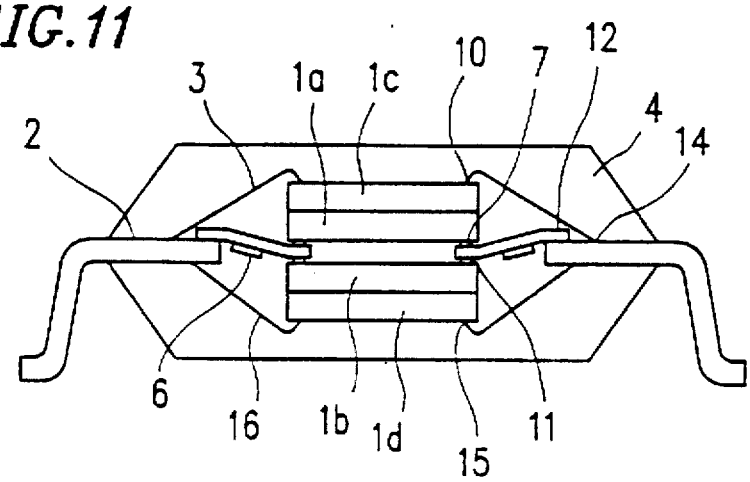
FIG. 11 is a sectional view of still another resin-sealed semiconductor device according to the present invention.

A third example of the resin-sealed semiconductor device according to the present invention will be described with reference to FIG. 11. The same components as those of the resin-sealed semiconductor device of Example 1 are denoted by the same reference numerals, and the description thereof is omitted.

The resin-sealed semiconductor device of Example 3 includes a semiconductor chip 1d and metal wires 16 in addition to the components of the resin-sealed semiconductor device of Example 1.

The four semiconductor chips 1a, 1b, 1c, and 1d are arranged vertically. The semiconductor chip 1d includes a first surface having a plurality of terminals 7 arranged thereon and a second surface opposite to the first surface. The second surface of the semiconductor chip 1d is bonded with the second surface of the semiconductor chip 1b with an adhesive, preferably, a silver base, a non-silver base, a D/B adhesion sheet, or the like. A circuit pattern is formed on a first surface of each of the semiconductor chips 1a to 1d.

The terminals 7 of the semiconductor chip 1d are electrically connected with the inner lead portions 2 by wire bonding. The metal wires 16 used for the wire bonding are preferably made of gold. A position at which each metal wire 16 is connected with the inner lead portion 2 is preferably somewhere on the bottom surface of the inner lead portion 2 corresponding to a range between the position at which the connecting terminal 12 of the flexible substrate 6 is connected with the inner lead portion 2 and the position 14.

Hereinbelow, the relationship between the circuit patterns of the semiconductor chips 1a to 1d and the sharing of the inner lead portions 2 among the semiconductor chips 1a to 1d will be described.

The situations (1) to (4) described in Example 1 are also applicable in Example 3. In addition to these cases, the inner lead portions 2 can be shared in the following cases (5) to (11).

Figure 12:
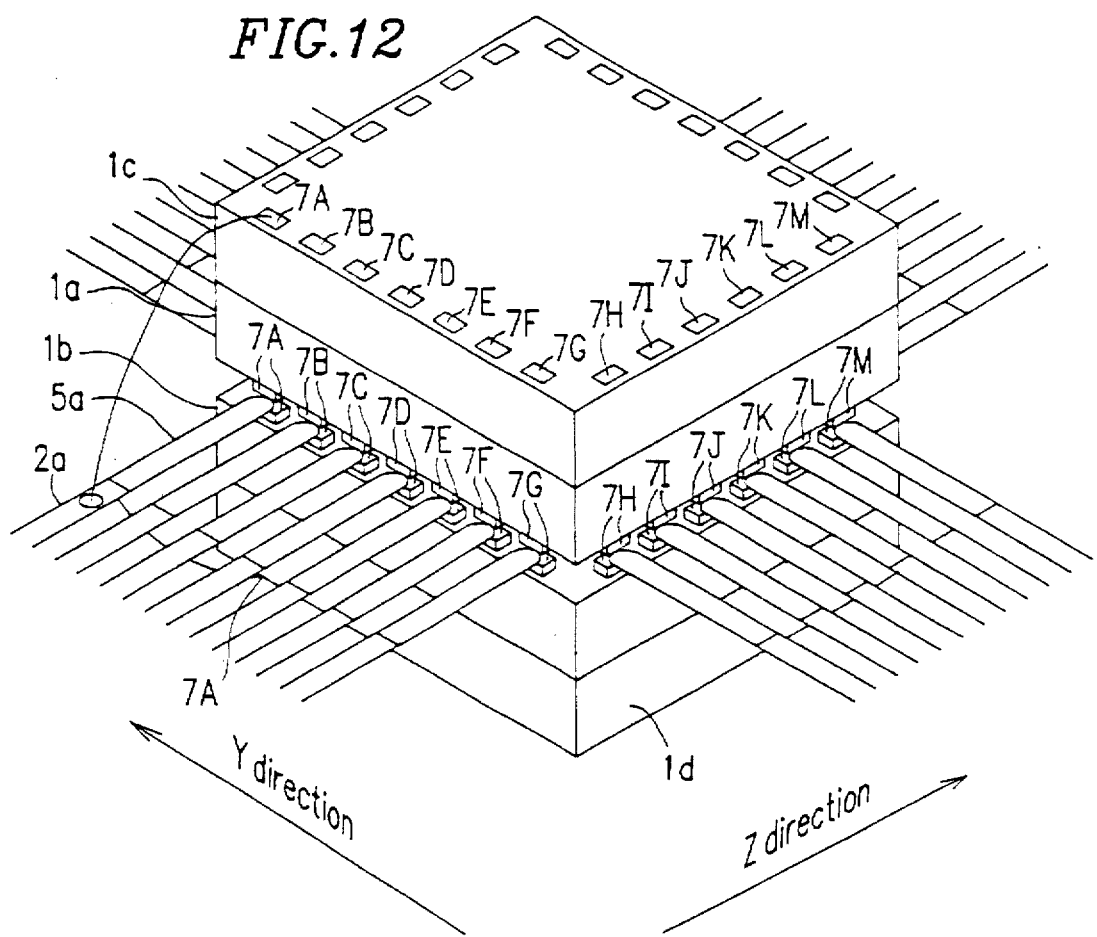
FIG. 12 is a perspective view of the resin-sealed semiconductive of FIG. 11.

(5) As shown in FIG. 12, when the circuit patterns of the semiconductor chips 1b and 1d are in a mirror-inversion relationship, they can share the same inner lead portions 2. However, chip selection control terminals (not shown) of the semiconductor chips 1b and 1d for selecting the semiconductor chip 1b or 1d are not allowed to share the same inner lead 2a.

When the semiconductor chips 1b and 1d share the same inner lead portions 2, the circuit patterns formed on the semiconductor chips 1b and 1d are not necessarily in a mirror-inversion relationship.

For example, when the mirror-inverted positions of the terminals of the semiconductor chip 1d in the first plane (Y-Z plane) are the same as the positions of the terminals of the semiconductor chip 1b, the semiconductor chips 1b and 1d can share the same inner lead portions 2. In this case, as in the above case, the chip selection control terminals are connected to separate inner leads.

Also, when the mirror-inverted positions of at least one of the terminals of the semiconductor chip 1d in the first plane (Y-Z plane) are the same as the positions of at least one of the terminals of the semiconductor chip 1b in the first plane (Y-Z plane), these terminals of the semiconductor chips 1b and 1d can share the same inner lead portions 2. In this situation, as in the above situation, the chip selection control terminals are connected to separate inner leads.

(6) When the circuit patterns of the semiconductor chips 1a and 1d are the same, they can share the same inner lead portions 2. However, as in the above case, chip selection control terminals (not shown) of the semiconductor chips 1a and 1d for selecting the semiconductor chip 1a or 1d are not allowed to share the same inner lead 2a.

When the semiconductor chips 1a and 1d share the same inner lead portions 2, the circuit patterns formed on the semiconductor chips 1a and 1d are not necessarily the same.

For example, when the positions of the terminals of the semiconductor chip 1d in the first plane (Y-Z plane) are the same as the positions of the terminals of the semiconductor chip 1a in the first plane (Y-Z plane), the semiconductor chips 1a and 1d can share the same inner lead portions 2. In this case, as in the above case, the chip selection control terminals are connected to separate inner leads.

Also, when the positions of at least one of the terminals of the semiconductor chip 1d in the first plane (Y-Z plane) are the same as the positions of at least one of the terminals of the semiconductor chip 1a in the first plane (Y-Z plane), these terminals of the semiconductor chips 1a and 1d can share the same inner lead portion 2. In this case, as in the above case, the chip selection control terminals are connected to separate inner leads.

(7) When the circuit patterns of the semiconductor chips 1c and 1d are in a mirror-inversion relationship, they can share the same inner lead portions 2. However, as in the above situation, chip selection control terminals (not shown) of the semiconductor chips 1c and 1d for selecting the semiconductor chip 1c or 1d are not allowed to share the same inner lead 2a.

When the semiconductor chips 1c and 1d share the same inner lead portions 2, the circuit patterns formed on the semiconductor chips 1c and 1d are not necessarily in a mirror-inversion relationship.

For example, when the mirror-inverted positions of the terminals of the semiconductor chip 1d in the first plane (Y-Z plane) are the same as the positions of the terminals of the semiconductor chip 1c in the first plane (Y-Z plane), the semiconductor chips 1c and 1d can share the same inner lead portion 2. In this case, as in the above case, the chip selection control terminals are connected to separate inner leads.

Also, when the mirror-inverted positions of at least one of the terminals of the semiconductor chip 1d in the first plane (Y-Z plane) are the same as the positions of at least one of the terminals of the semiconductor chip 1c in the first plane (Y-Z plane), these terminals of the semiconductor chips 1c and 1d can share the same inner lead portion 2. In this case, as in the above case, the chip selection control terminals are connected to separate inner leads.

(8) When the circuit patterns of the semiconductor chips 1b and 1d are in a mirror-inversion relationship and the circuit patterns of the semiconductor chips 1a and 1d are the same, the semiconductor chips 1a, 1b, and 1d can share the same inner lead portions 2. However, as in the above case, chip selection control terminals (not shown) of the semiconductor chips 1a, 1b, and 1d for selecting the semiconductor chip 1a, 1b or 1d are not allowed to share the same inner lead 2a.

When the semiconductor chips 1a, 1b, and 1d share the same inner lead portions 2, the circuit patterns formed on the semiconductor chips 1b and 1d are not necessarily in a mirror-inversion relationship and the circuit pattern formed on the semiconductor chips 1a and 1d are not necessarily the same.

For example, when the mirror-inverted positions of the terminals of the semiconductor chip 1d in the first plane (Y-Z plane) are the same as the positions of the terminals of the semiconductor chip 1b in the first plane (Y-Z plane) and the positions of the terminals of the semiconductor chip 1d are the same as the positions of the terminals of the semiconductor chip 1a, the semiconductor chips 1a, 1b, and 1d can share the same inner lead portions 2. In this case, as in the above case, the chip selection control terminals for selecting the semiconductors 1a, 1b, or 1d are connected to separate inner leads.

Also, when the positions of at least one of the terminals of the semiconductor chip 1d in the first plane (Y-Z direction) are the same as the positions of at least one of the terminals of the semiconductor chip 1a in the first plane (Y-Z direction) and the mirror-inverted positions of at least one of the terminals of the semiconductor chip 1b in the first plane (Y-Z plane), these terminals of the semiconductor chips 1a, 1b, and 1d can share the same inner lead portions 2. In this case, as in the above case, the chip selection control terminals for selecting the semiconductors 1a, 1b, or 1d are connected to separate inner leads.

(9) When the circuit patterns of the semiconductor chips 1b and 1d are in a mirror-inversion relationship and the circuit patterns on the semiconductor chips 1c and 1d are in a mirror-inversion relationship, the semiconductor chips 1b, 1c, and 1d can share the same inner lead portions 2. However, as in the above situation, chip selection control terminals (not shown) of the semiconductor chips 1b, 1c, and 1d for selecting the semiconductor chip 1b, 1c or 1d are not allowed to share the same inner lead 2a.

When the semiconductor chips 1b, 1c, and 1d share the same inner lead portions 2, the circuit patterns formed on the semiconductor chips 1b and 1d are not necessarily in a mirror-inversion relationship and the circuit pattern formed on the semiconductor chips 1c and 1d are not necessarily in a mirror-inversion relationship.

For example, when the mirror-inverted positions of the terminals of the semiconductor chip 1d in the first plane (Y-Z plane) are the same as the positions of the terminals of the semiconductor chip 1b in the first plane (Y-Z plane) and the mirror-inverted positions of the terminals of the semiconductor chip 1d in the first plane (Y-Z plane) are the same as the positions of the terminals of the semiconductor chip 1c in the first plane (Y-Z plane), the semiconductor chips 1b, 1c, and 1d can share the same inner lead portions 2. In this case, as in the above case, the chip selection control terminals for selecting the semiconductors 1b, 1c, or 1d are connected to separate inner leads.

Also, when the positions of at least one of the terminals of the semiconductor chip 1d in the first plane (Y-Z plane) are the same as the mirror-inverted positions of at least one of the terminals of the semiconductor chip 1b in the first plane (Y-Z plane) and the mirror-inverted positions of at least one of the terminals of the semiconductor chip 1c in the first plane (Y-Z plane), these terminals of the semiconductor chips 1b, 1c, and 1d can share the same inner lead portions 2. In this case, as in the above case, the chip selection control terminals for selecting the semiconductors 1b, 1c, or 1d are connected to separate inner leads.

(10) When the circuit patterns of the semiconductor chips 1a and 1d are the same and the circuit patterns on the semiconductor chips 1c and 1d are in a mirror-inversion relationship, the semiconductor chips 1a, 1c, and 1d can share the same inner lead portions 2. However, as in the above situation, chip selection control terminals (not shown) of the semiconductor chips 1a, 1c, and 1d for selecting the semiconductor chip 1a, 1c or 1d are not allowed to share the same inner lead 2a.

When the semiconductor chips 1a, 1c, and 1d share the same inner lead portions 2, the circuit patterns formed on the semiconductor chips 1a and 1d are not necessarily the same and the circuit patterns formed on the semiconductor chips 1c and 1d are not necessarily in a mirror-inversion relationship.

For example, when the mirror-inverted positions of the terminals of the semiconductor chip 1d in the first plane (Y-Z plane) are the same as the positions of the terminals of the semiconductor chip 1c in the first plane (Y-Z plane) and the positions of the terminals of the semiconductor chip 1d in the first plane (Y-Z plane) are the same as the positions of the terminals of the semiconductor chip 1a in the first plane (Y-Z plane), the semiconductor chips 1a, 1c, and 1d can share the same inner lead portions 2. In this case, as in the above case, the chip selection control terminals for selecting the semiconductors 1a, 1c, or 1d are connected to separate inner leads.

Also, when the positions of at least one of the terminals of the semiconductor chip 1d in the first plane (Y-Z plane) are the same as the positions of at least one of the terminals of the semiconductor chip 1a in the first plane (Y-Z plane) and the mirror-inverted positions of at least one of the terminals of the semiconductor chip 1c in the first plane (Y-Z plane), these terminals of the semiconductor chips 1a, 1c, and 1d can share the same inner lead portions 2. In this case, as in the, above case, the chip selection control terminals for selecting the semiconductors 1a, 1c, or 1d are connected to separate inner leads.

(11) When the circuit patterns of the semiconductor chips 1b and 1d are in a mirror-inversion relationship, the circuit patterns of the semiconductor chips 1a and 1d are the same, and the circuit patterns of the semiconductor chips 1c and 1d are in a mirror-inversion relationship, the semiconductor chips 1a to 1d can share the same inner lead portions 2. However, as in the above situation, chip selection control terminals (not shown) of the semiconductor chips 1a to 1d for selecting the semiconductor chip 1a, 1b, 1c or 1d are not allowed to share the same inner lead 2a.

When the semiconductor chips 1a to 1d share the same inner lead portions 2, the circuit patterns formed on the semiconductor chips 1b and 1d are not necessarily in a mirror-inversion relationship, the circuit patterns formed on the semiconductor chips 1a and 1d are not necessarily the same, and the circuit pattern formed on the semiconductor chips 1c and 1d are not necessarily in a mirror-inversion relationship.

For example, when the mirror-inverted positions of the terminals of the semiconductor chip 1d in the first plane (Y-Z plane) are the same as the positions of the terminals of the semiconductor chip 1c in the first plane (Y-Z plane), the positions of the terminals of the semiconductor chip 1d in the first plane (Y-Z plane) are the same as the terminals of the semiconductor chip 1a in the first plane (Y-Z plane), and the mirror-inverted positions of the terminals of the semiconductor chip 1d in the first direction (Y-Z plane) are the same as the positions of the terminals of the semiconductor chip 1b, the semiconductor chips 1a to 1d can share the same inner lead portions 2. In this case, as in the above case, the chip selection control terminals of the semiconductor chips 1a to 1d for selecting the semiconductor chips are connected to separate inner leads.

Also, when the positions of at least one of the terminals of the semiconductor chip 1d in the first plane (Y-Z plane) are the same as the positions of at least one of the terminals of the semiconductor chip 1a in the first plane (Y-Z plane) and the mirror-inverted positions of at least one of the terminals of each of the semiconductor chips 1b and 1c in the first plane (Y-Z plane), these terminals of the semiconductor chips 1a to 1d can share the same inner lead portions 2. In this case, as in the above case, the chip selection control terminals for selecting the semiconductor chips 1a, 1b, 1c, or 1d are connected to separate inner leads.

When the inner leads are shared as described in the above situations (1) to (11), the number of inner leads of the inner lead portions 2 can be reduced compared with the case where they are not shared.

When the semiconductor chips 1a to 1d cannot share the inner leads of the inner lead portions 2, the respective terminals of the semiconductor chips 1a to 1d are connected with their individual inner leads of the inner lead portions 2.

(Example 4)

Figure 13:
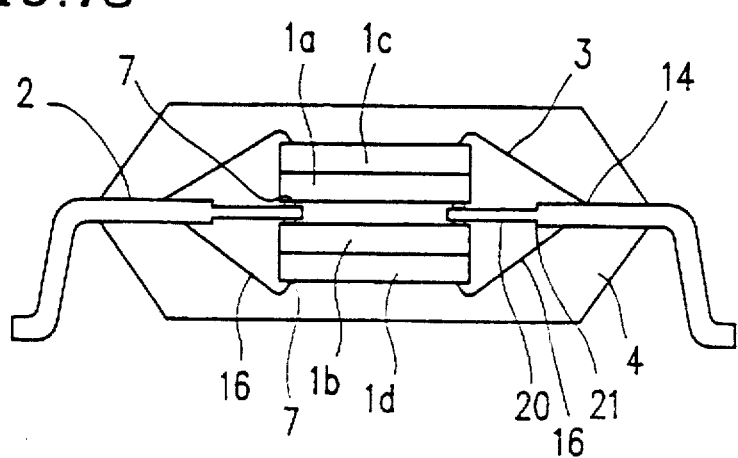
FIG. 13 is a sectional view of still another resin-sealed semiconductor device according to the present invention.

A fourth example of the resin-sealed semiconductor device according to the present invention will be described with reference to FIG. 13. The same components as those of the resin-sealed semiconductor device of Example 2 are denoted by the same reference numerals, and the description thereof is omitted.

The resin-sealed semi conductor device of Example 4 includes a semiconductor chip 1d and metal wires 16, in addition to the components of the resin-sealed semiconductor device of Example 2.

The four semiconductor chips 1a, 1b, 1c, and 1d are arranged vertically. The semiconductor chip 1d includes a first surface having a plurality of terminals 7 arranged thereon and a second surface opposite to the first surface. The second surface of the semiconductor chip 1d is bonded with the second surface of the semiconductor chip 1b with an adhesive, preferably, a silver base, a non-silver base, an D/B adhesion sheet, or the like. A circuit pattern is formed on a first surface of each of the semiconductor chips 1a to 1d.

The terminals 7 of the semiconductor chip 1d are electrically connected with the inner lead portions 2 by wire bonding. The metal wires used for the wire bonding are preferably made of gold. Each metal wire 16 is connected with the inner lead portion 2 preferably at a position on the bottom surface of the inner lead portion 2 located between a position 21 at which the tapered portion 20 shifts to the inner lead portion 2 and a position corresponding to the position 14.

The relationship between the circuit patterns of the semiconductor chips 1a to 1d and the sharing of the inner lead portions 2 is the same as that described in Example 3, and, therefore the description thereof is omitted here.

Next, a method for fabricating the resin-sealed semiconductor device of Example 1 will be described with reference to FIGS. 14A to 14G.

Figure 14A:
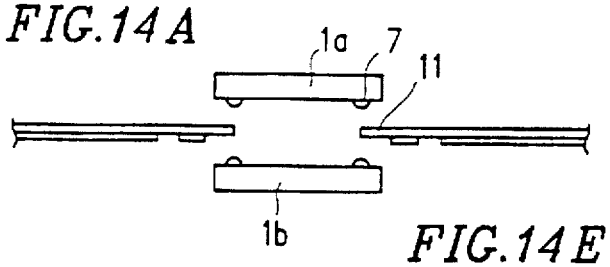
FIGS. 14A to 14G fabrication process of the resin-sealed semiconductor device of FIG. 6.
Figure 14B:
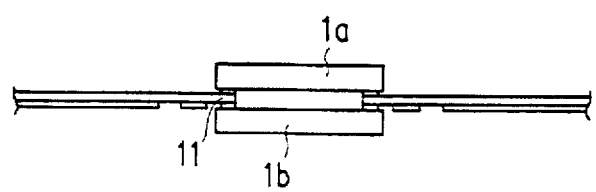

The semiconductor chips 1a and 1b are disposed so that the first surface of the semiconductor chip 1a faces the first surface of the semiconductor chip 1b (FIG. 14A). The connecting terminals 11 are interposed between the semiconductor chips 1a and 1b so as to be bonded with the terminals 7 of the semiconductor chips 1a and 1b (FIG. 14B). In the case where the semiconductor chips 1a and 1b have different circuit patterns from each other, the terminals 7 of the semiconductor chips 1a and 1b are connected to different inner leads. In the case where the circuit patterns of the semiconductor chips 1a and 1b are in a mirror-inversion relationship, the pads (terminals) of the semiconductor chips 1a and 1b are at the same positions when the semiconductor chips 1a and 1b are attached via the connecting terminals 11 with the first surfaces facing each other. The terminals 7 located at the same positions are connected to the same inner leads. In this case, however, as described above, chip selection control terminals are connected to different inner leads.

Metal bumps may be formed on the tops of the pads of the first surfaces of the semiconductor chips 1a and 1b or the tops of the connecting terminals 11.

When no bumps are formed on the pads of the semiconductor chips 1a and 1b or the connecting terminals 11, the pads of the semiconductor chips 1a and 1b are directly connected with the connecting terminals 11.

Metal bumps may be formed on the pads of the semiconductor chips 1a and 1b by sputtering, or stud bumps may be formed by wire bonding.

In the case where bumps are formed on the tops of the connecting terminals 11, transfer bumps and the like are used. The connecting terminals 11 of the flexible substrate 6 are formed as follows. A copper film is formed on the flexible substrate 6 made of polyimide such as those used for a tape carrier package (TCP) and the like, and the copper film is patterned to form the connecting terminals 11. In order to form bumps on the connecting terminals 11, the connecting terminals 11 are plated with tin (Sn) before being bonded with the terminals 7 of the semiconductor chips 1a and 1b.

During bonding of the terminals 7 of the semiconductor chips 1a and 1b with the connecting terminals 11, the semiconductor chips 1a and 1b and the flexible substrates 6 are heated to about 500° C. Then, the semiconductor chips 1a and 1b are pressed from the upper and lower surfaces of the combination thereof with a force of about 20 to 30 g per terminal. For example, when each of the semiconductor chips 1a and 1b has 56 terminals, a force of about 1.5 kg is applied from the upper and lower surfaces of the combination of the semiconductor chips 1a and 1b.

The load applied when the terminals 7 of the semiconductor chips 1a and 1b are bonded with the connecting terminals 11 is greater than the load applied when the second surface of the semiconductor chip 1a is die-bonded with the second surface of the semiconductor chip 1c. Accordingly, the former process is conducted prior to the latter die bonding process.

Figure 14C:
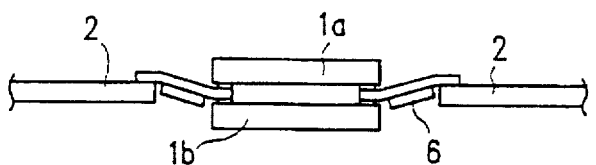

The connecting terminals 12 are electrically connected to the inner lead portions 2 of the lead frame with, for example, an anisotropic conductive adhesive (FIG. 14C).

Figure 14D:
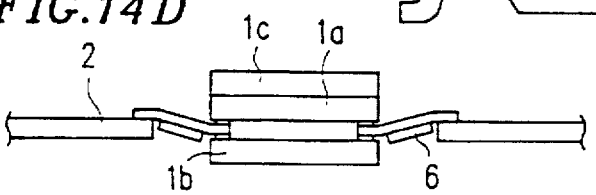

The second surface of the semiconductor chip 1c is bonded with the second surface of the semiconductor chip 1a by an adhesive for die bonding (FIG. 14D). Before die bonding, the second surfaces of the semiconductor chips may be scrubbed in order to improve the adhesion of the semiconductor chips.

Figure 14E:
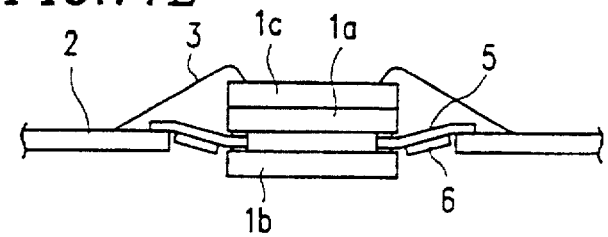

The pads of the semiconductor chip 1c are wire-bonded to the inner lead portions 2 via metal wires 3 (FIG. 14E). In other words, the pads of the semiconductor chip 1c are electrically connected with the inner lead portions 2. As described above, in the case where the circuit pattern of the semiconductor chip 1c is the same as the circuit pattern of the semiconductor chip 1b, the pads of the semiconductor chips 1b and 1c located at the same positions are connected with the same inner leads. Chip selection control terminals are, however, connected to different inner leads.

Figure 14F:
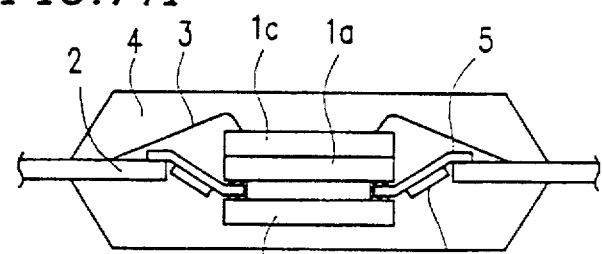
Figure 14G:
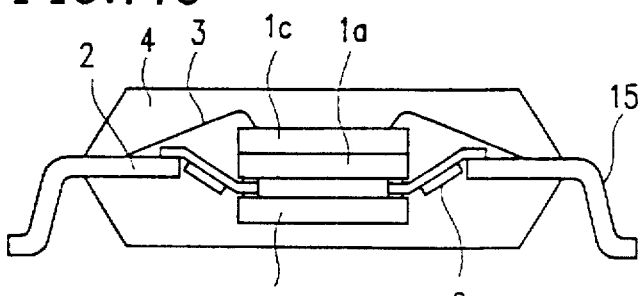

Thereafter, the semiconductor chips 1a to 1c and the like are sealed with a resin (FIG. 14F). The outer lead portions 15 of the lead frame is then formed into an appropriate shape, thus to complete the resin-sealed semiconductor device (FIG. 14G).

As described above, after the first surface of the semiconductor chip 1a and the first surface of the semiconductor chip 1b are bonded to face each other, the second surface of the semiconductor chip 1c can be bonded with the second surface of these semiconductor chip 1a or 1b. At the bonding of the second surface of the semiconductor chip 1c with the second surface of the semiconductor 1a or 1b, the first surface of the semiconductor chip 1a or 1b where the circuit pattern is formed is not in contact with a work stand. The circuit pattern is therefore protected from being destroyed.

Next, a method for fabricating the resin-sealed semiconductor device of Example 2 will be described with reference to FIGS. 15A to 15E.

The end portions of the lead frame are thinned by a chemical method such as etching or a mechanical method such as coining.

Figure 15A:
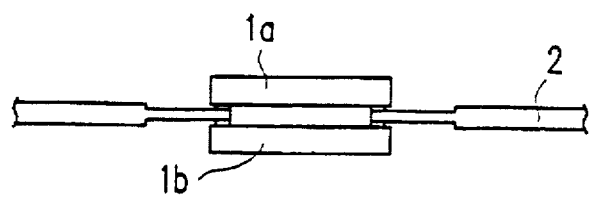
FIGS. 15A to 15E show a fabrication process of the resin-sealed semiconductor device of FIG. 9.

The semiconductor chips 1a and 1b are disposed so that the first surface of the semiconductor chip 1a faces the first surface of the semiconductor chip 1b. The tapered portions 20 are interposed between the semiconductor chips 1a and 1b so as to be bonded with the terminals 7 of the semiconductor chips 1a and 1b (FIG. 15A).

Figure 15B:
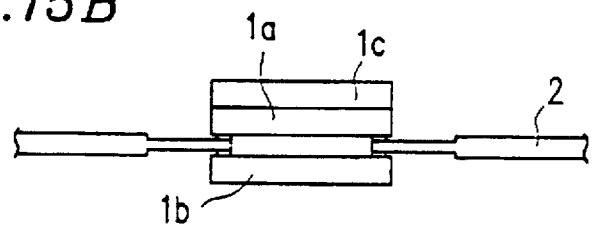

The second surface of the semiconductor chip 1c is bonded with the second surface of the semiconductor chip 1a with an adhesive for die bonding (FIG. 15B). Before die bonding, the second surfaces of the semiconductor chips may be scrubbed in order to improve the adhesion of the semiconductor chips.

Figure 15C:
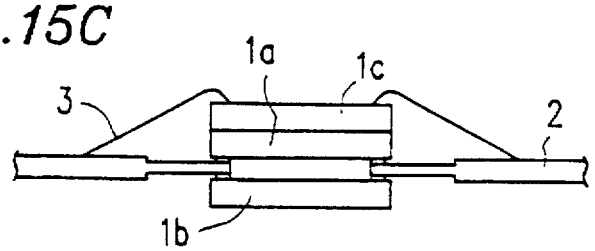

The pads of the semiconductor chip 1c are wire-bonded to the inner lead portions 2 via metal wires 3 (FIG. 15C). In other words, the pads of the semiconductor chip 1c are electrically connected with the inner lead portion 2. As described above, in the case where the circuit pattern of the semiconductor chip 1c is the same as the circuit pattern of the semiconductor chip 1b, the pads of the semiconductor chips 1b and 1c located at the same positions are connected with the same inner leads. Chip selection control terminals are, however, connected to different inner-leads.

Figure 15D:
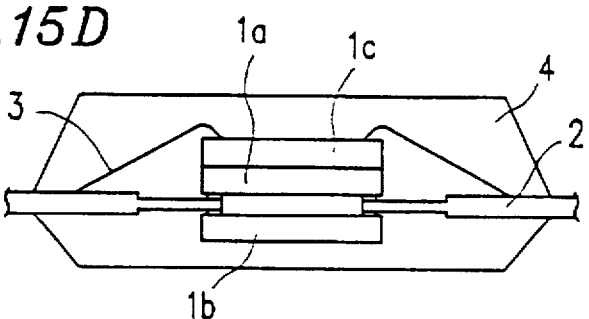
Figure 15E:
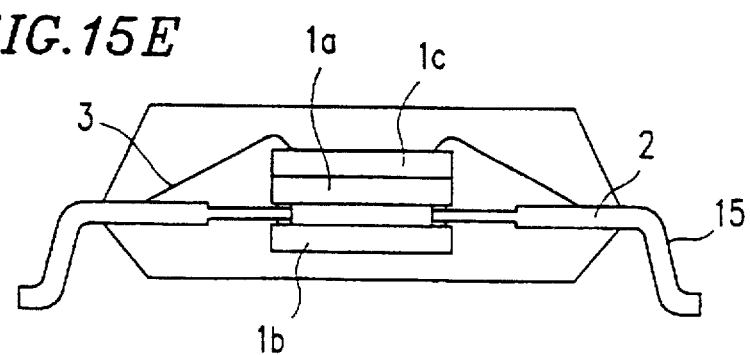

Thereafter, the semiconductor chips 1a to 1c and the like are sealed simultaneously with a resin (FIG. 15D). The outer lead portions 15 of the lead frame is then formed into an appropriate shape, thus to complete the resin-sealed semiconductor device (FIG. 15E).

In the above method for fabricating the resin-sealed semiconductor device of Example 2, the flexible substrates 6 are not used. Accordingly, the process for connecting the connecting terminals 12 of the flexible substrates 6 and the inner lead portions 2 of the lead frame are not necessary.

As described above, after the first surface of the semiconductor chip 1a and the first surface of the semiconductor chip 1b are bonded to face each other, the second surface of the semiconductor chip 1c can be bonded with the second surface of the semiconductor chip 1a or 1b. At the bonding of the second surface of the semiconductor chip 1c with the second surface of the semiconductor 1a or 1b, the first surface of the semiconductor chip 1a or 1b where the circuit pattern is formed is not in contact with a work stand. The circuit pattern is therefore protected from being destroyed.

Next, a method for fabricating the resin-sealed semiconductor device of Example 3 will be described with reference to FIGS. 16A to 16H.

Figure 16A:
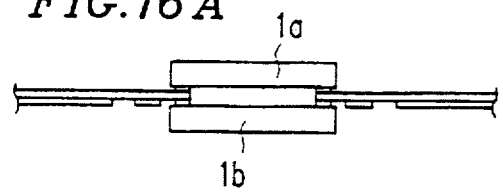
FIGS. 16A to 16H show a fabrication process of the resin-sealed semi-conductor device of FIG. 11.
Figure 16B:
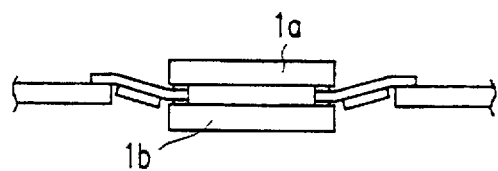
Figure 16C:
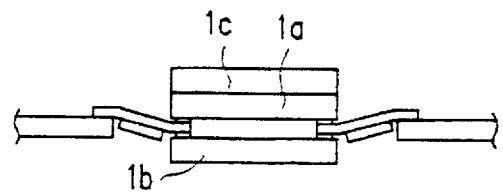

The steps shown in FIGS. 16A to 16C correspond to the steps shown in FIGS. 14B to 14D in Example 1. Therefore, the description of these steps is omitted.

Figure 16D:
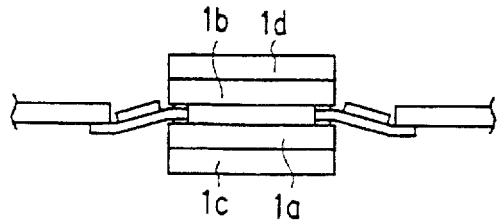

After the bonding of the second surface of the semiconductor chip 1c with the second surface of the semiconductor chip 1a, the semiconductors 1a to 1c and the lead frame are inverted. In order to pre vent the first surface of the semiconductor chip 1c from being in direct contact with a work stand, an elastic member (not shown) such as an O ring is disposed under the first surface of the semiconductor chip 1c. Thus, with the semiconductor chip 1c supported by the O ring and the work stand, the second surface of the semiconductor chip 1d is bonded with the second surface of the semiconductor chip 1b (FIG. 16D).

Figure 16E:
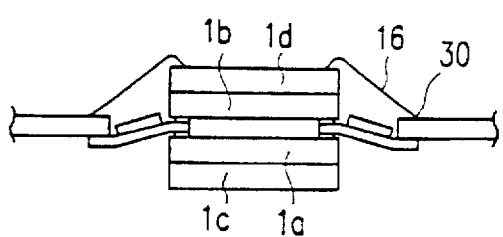
Figure 16F:
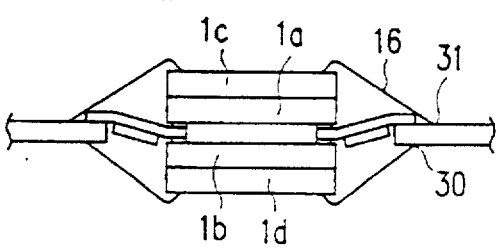

The pads of the semiconductor chips 1d are electrically connected with the inner lead portions 2 via the metal wires 16 (FIGS. 16E). Thereafter, the semiconductors 1a to 1d and the lead frame are inverted. In order to prevent the first surface of the semiconductor chip 1d from being in direct contact with the work stand, an elastic member (not shown) such as an 9 ridge is disposed under the first surface of the semiconductor chip 1d. Thus, the semiconductor chip 1d is supported by the O ring and the work stand. The pads of the semiconductor chips 1c are electrically connected with the inner lead portions 2 via the metal wires 16 (FIG. 16F). A position 31 at which the pads of the semiconductor chip 1c are wire-bonded to the inner lead portions 2 is farther from the semiconductor chips than a position 30 at which the pads of the semiconductor chip 1d are wire-bonded to the inner lead portions 2.

Figure 16G:
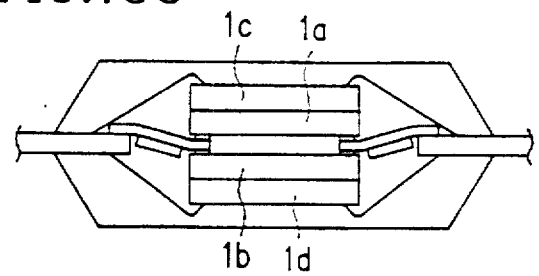
Figure 16H:
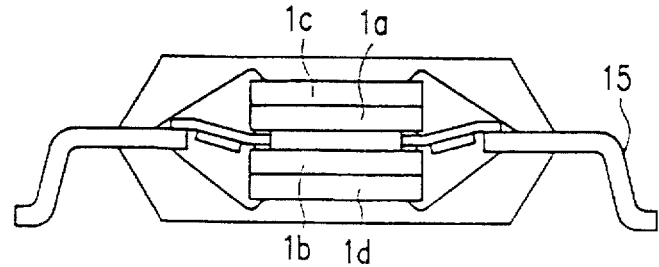

The steps shown in FIGS. 16G and 16H correspond to the steps shown in FIGS. 14F and 14G in Example 1. Therefore, the description of these steps is omitted.

The resin-sealed semiconductor device of Example 4 is fabricated by combining the process corresponding to the steps shown in FIGS. 15A and 15B and the process corresponding to the steps shown in 16D to 16H.

At the wiring bonding, in order to protect the first surfaces of the semiconductor chips where the circuits are formed, the first surfaces may be coated with polyimide with a thickness of about 10 μm. When the first surfaces of the semiconductor chips are coated with polyimide with a thickness of 10 μm or more and an O ring is interposed between the semiconductor chips and the work stand, the first surfaces of the semiconductor chips where the circuits are formed are protected even when a load required for die bonding is applied to the semiconductor chips. For example, with the above coating and the use of an O ring, the first surface can be protected even when a load of about 50 to 100 g per pad is applied during die bonding. Also, with the above coating and the use of an O ring, the first surface can be protected even when a load of about 100 g per pad is applied during wire bonding.

Methods for applying polyimide to the semiconductor chips to a thickness of 10 μm include the following. Polyimide may be applied to the entire surface of a wafer, and the resultant polyimide film etched by photolithography to open the wire pad portions. Alternatively, a polyimide film may be formed on a wafer by screen printing at portions except for the wire pad portions.

The O ring may be made of a substance obtained by crosslinking chain Teflon with carbon black and filling with a fluoric rubber material. Other substances may also be used as far as they have drug resistance and heat resistance and are elastic by heating to 200° to 300° C. The elastic member interposed between the semiconductor chip and the work stand may not necessarily be in a ring shape, but a bar-shaped or plane member may also be used as far as an elasticity of a certain level or higher can be ensured.

The order of the above-described steps may be changed. For example, the semiconductor chip 1c may be wire-bonded with the inner lead portions 2 immediately after the second surface of the semiconductor chip 1c is die-bonded with the second surface of the semiconductor chip 1a. Then, after the inversion of the semiconductor chips and the lead frame, the second surface of the semiconductor chip 1d is die-bonded with the second surface of the semiconductor chip 1b, and then the semiconductor chip 1d is wire-bonded with the inner lead portions 2.

Thus, according to the resin-sealed semiconductor device of the present invention, three or four semiconductor chips are sealed in one semiconductor device. Since the semiconductor chips are directly bonded, the bonding of the semiconductor chips to the die-pad of the lead frame is not necessary. Thus, the thickness of the resin-sealed semiconductor device in the vertical direction can be made small.

Three or four semiconductor chips can be molded at one time by transfer molding. Accordingly, the material and cost required for one semiconductor chip can be reduced.

Since the pads of the semiconductor chips and the lead frame can be electrically connected by wire bonding, cost increase can be suppressed when the type of semiconductor chips is changed.

Three or four semiconductor chips are arranged vertically in one resin-sealed semiconductor device. Accordingly, the size in the horizontal direction can be reduced. Thus, a resin-sealed semiconductor device with large capacity and high density can be obtained.

When the semiconductor chips are memories, memories with a capacity four times as large as the maximum capacity obtainable in the wafer process can be sealed in one resin-sealed semiconductor device.

When the semiconductor chips are different in type from each other, the resin-sealed semiconductor device according to the present invention can be used as a multi-chip module.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A resin-sealed semiconductor device comprising:

a first semiconductor chip having a plurality of terminals, a first surface on which the plurality of terminals are formed, and a second surface opposite to the first surface;

a second semiconductor chip having a plurality of terminals, a first surface on which the plurality of terminals are formed, and a second surface opposite to the first surface;

a third semiconductor chip having a plurality of terminals, a first surface on which the plurality of terminals are formed, and a second surface opposite to the first surface; and a plurality of leads including a first lead formed from a wire and a second lead formed from a connecting terminal line, where the connecting terminal line is formed on a flexible substrate;

a lead frame electrically connected with at least one of the plurality of terminals of the first semiconductor chip, at least one of the plurality of terminals of the second semiconductor chip, and at least one of the plurality of terminals of the third semiconductor chip through the plurality of leads;

wherein the first semiconductor chip and the second semiconductor chip are disposed so that the first surface of the first semiconductor chip and the first surface of the second semiconductor chip face each other, and the second surface of the first semiconductor chip is bonded with the second surface of the third semiconductor chip.

the connecting terminal line connects at least one of the plurality of terminals of the first surface of the first semiconductor chip and at least one of the plurality of terminals of the first surface of the second semiconductor chip to the lead frame, and the wire connects at least one of the plurality of terminals of the first surface of the third semiconductor chip to the lead frame.

2. A resin-sealed semiconductor device according to claim 1, further comprising a fourth semiconductor chip having a plurality of terminals, a first surface on which the plurality of terminals are formed, and a second surface opposite to the first surface, wherein the second surface of the second semiconductor chip is bonded with the second surface of the fourth semiconductor chip.

3. A resin-sealed semiconductor device according to claim 1, wherein a circuit pattern of the first semiconductor chip and a circuit pattern of the second semiconductor chip are in a mirror-inverted relationship, the first semiconductor chip has at least one control terminal for selecting the first semiconductor chip, and the second semiconductor chip has at least one control terminal for selecting the second semiconductor chip.

4. A resin-sealed semiconductor device according to claim 1, wherein a circuit pattern of the first semiconductor chip and a circuit pattern of the third semiconductor chip are in a mirror-inverted relationship, the first semiconductor chip has at least one control terminal for selecting the first semiconductor chip, and the third semiconductor chip has at least one control terminal for selecting the third semiconductor chip.

5. A resin-sealed semiconductor device according to claim 1, wherein mirror-inverted positions of at least one of the terminals of the first semiconductor chip in a first plane are the same as positions of at least one of the terminals of the third semiconductor chip in the first plane.

6. A resin-sealed semiconductor device according to claim 1, wherein positions of at least one of the terminals of the second semiconductor chip in a first plane are the same as positions of at least one of the terminals of the third semiconductor chip in the first plane.

7. A resin-sealed semiconductor device according to claim 2, wherein positions of at least one of the terminals of the second semiconductor chip in a first plane are the same as positions of at least one of the terminals of the third semiconductor chip in the first plane.

8. A resin-sealed semiconductor device according to claim 2, wherein positions of at least one of the terminals of the first semiconductor chip in a first plane are the same as positions of at least one of the terminals of the fourth semiconductor chip in the first plane.

9. A resin-sealed semiconductor device according to claim 2, wherein mirror-inverted positions of at least one of the terminals of the fourth semiconductor chip in a first plane are the same as positions of at least one of the terminals of the second semiconductor chip in the first plane.

10. A resin-sealed semiconductor device according to claim 2, wherein mirror-inverted positions of at least one of the terminals of the fourth semiconductor chip in a first plane are the same as positions of at least one of the terminals of the third semiconductor chip in the first plane.

11. A resin-sealed semiconductor device according to claim 2, wherein a circuit pattern of the second semiconductor chip and a circuit pattern of the fourth semiconductor chip are in a mirror-inverted relationship, the second semiconductor chip has at least one control terminal for selecting the second semiconductor chip, and the fourth semiconductor chip has at least one control terminal for selecting the fourth semiconductor chip.

12. A resin-sealed semiconductor device according to claim 2, wherein a circuit pattern of the third semiconductor chip and a circuit pattern of the fourth semiconductor chip are in a mirror-inverted relationship, the third semiconductor chip has at least one control terminal for selecting the third semiconductor chip, and the fourth semiconductor chip has at least one control terminal for selecting the fourth semiconductor chip.

13. A resin-sealed semiconductor device according to claim 1, wherein circuit patterns of the first, second, and third semiconductor chips are different from one another, and the terminals of the first, second, and third semiconductor chips are connected with respective different leads.

14. A resin-sealed semiconductor device according to claim 2, wherein circuit patterns of the first, second, third, and fourth semiconductor chips are different from one another, and the terminals of the first, second, third, and fourth semiconductor chips are connected with respective different leads.

15. A resin-sealed semiconductor device comprising:

a first semiconductor chip having a plurality of terminals, a first surface on which the plurality of terminals are formed, and a second surface opposite to the first surface;

a second semiconductor chip having a plurality of terminals, a first surface on which the plurality of terminals are formed, and a second surface opposite to the first surface;

a third semiconductor chip having a plurality of terminals, a first surface on which the plurality of terminals are formed, and a second surface opposite to the first surface;

a lead frame having inner and outer portions, said inner portion being connected to at least one of the plurality of terminals of the first surface of the first semiconductor chip and at least one of the plurality of terminals of the first surface of the second semiconductor chip, wherein the first semiconductor chip and the second semiconductor chip are disposed so that the first surface of the first semiconductor chip and the first surface of the second semiconductor chip face each other; and the second surface of the first semiconductor chip is bonded with the second surface of the third semiconductor device, wherein a thickness of said inner portion of the lead frame is smaller than a thickness of the outer portion of the lead frame, both said inner portion and said outer portion being located in a resin of the semiconductor device.

16. A resin-sealed semiconductor device according to claim 15, further comprising a fourth semiconductor chip having a plurality of terminals, a first surface on which the plurality of terminals are formed, and a second surface opposite to the first surface, wherein the second surface of the second semiconductor chip is bonded with the second surface of the fourth semiconductor chip.

17. A resin-sealed semiconductor device according to claim 15, wherein a circuit pattern of the first semiconductor chip and a circuit pattern of the second semiconductor chip are in a mirror-inverted relationship, the first semiconductor chip has at least one control terminal for selecting the first semiconductor chip, and the second semiconductor chip has at least one control terminal for selecting the second semiconductor chip.

18. A resin-sealed semiconductor device according to claim 15, wherein a circuit pattern of the first semiconductor chip and a circuit pattern of the third semiconductor chip are in a mirror-inverted relationship, the first semiconductor chip has at least one control terminal for selecting the first semiconductor chip, and the third semiconductor chip has at least one control terminal for selecting the third semiconductor chip.

19. A resin-sealed semiconductor device according to claim 15, wherein mirror-inverted positions of at least one of the terminals of the first semiconductor chip in a first plane are the same as positions of at least one of the terminals of the third semiconductor chip in the first plane.

20. A resin-sealed semiconductor device according to claim 15, wherein positions of at least one of the terminals of the second semiconductor chip in a first plane are the same as positions of at least one of the terminals of the third semiconductor chip in the first plane.

21. A resin-sealed semiconductor device according to claim 16, wherein positions of at lest one of the terminals of the second semiconductor chip in a first plane are the same as positions of at least one of the terminals of the third semiconductor chip in the first plane.

22. A resin-sealed semiconductor device according to claim 16, wherein positions of at least one of the terminals of the first semiconductor chip in a first plane are the same as positions of at least one of the terminals of the fourth semiconductor chip in the first plane.

23. A resin-sealed semiconductor device according to claim 16, wherein mirror-inverted positions of at least one of the terminals of the fourth semiconductor chip in a first plane are the same as positions of at lest one of the terminals of the second semiconductor chip in the first plane.

24. A resin-sealed semiconductor device according to claim 16, wherein mirror-inverted positions of at least one of the terminals of the fourth semiconductor chip in a first plane are the same as positions of at least one of the terminals of the third semiconductor chip in the first plane.

25. A resin-sealed semiconductor device according to claim 16, wherein a circuit pattern of the second semiconductor chip and a circuit pattern of the fourth semiconductor chip are in a mirror-inverted relationship, the second semiconductor chip has at least one control terminal for selecting the second semiconductor chip, and the fourth semiconductor chip has at least one control terminal for selecting the fourth semiconductor chip.

26. A resin-sealed semiconductor device according to claim 16, wherein a circuit pattern of the third semiconductor chip and a circuit pattern of the fourth semiconductor chip are in a mirror-inverted relationship.

the third semiconductor chip has at least one control terminal for selecting the third semiconductor chip, and the fourth semiconductor chip has at least one control terminal for selecting the fourth semiconductor chip.

27. A resin-sealed semiconductor device according to claim 15, wherein circuit patterns of the first, second, and third semiconductor chips are different from one another, and the terminals of the first, second, and third semiconductor chips are connected with respective different leads.

28. A resin-sealed semiconductor device according to claim 16, wherein circuit patterns of the first, second, third, and fourth semiconductor chips are different from one another, and the terminals of the first, second, third, and fourth semiconductor chips are connected with respective different leads.

29. A resin-sealed semiconductor device according to claim 2, wherein one of the plurality of leads is formed from another wire for connecting at least one of the plurality of terminals of the first surface of the fourth semiconductor chip to the lead frame.

30. A resin-sealed semiconductor device according to claim 16, wherein the lead frame is electrically connected to at least one of the plurality of terminals of the first surface of the fourth semiconductor chip through a wire.

* * * * *